(12) United States Patent
Kothari

(10) Patent No.: US 8,115,989 B2
(45) Date of Patent: Feb. 14, 2012

(54) ANTI-STICTION ELECTRODE

(75) Inventor: Manish Kothari, Cupertino, CA (US)

(73) Assignee: Qualcomm Mems Technologies, Inc., San Diego, CA (US)

( * ) Notice: Subject to any disclaimer, the term of this patent is extended or adjusted under 35 U.S.C. 154(b) by 130 days.

(21) Appl. No.: 12/562,024

(22) Filed: Sep. 17, 2009

(65) Prior Publication Data

US 2011/0063713 A1    Mar. 17, 2011

(51) Int. Cl.
G02B 26/00 (2006.01)
G02F 1/29 (2006.01)
G09G 3/34 (2006.01)

(52) U.S. Cl. ........ 359/295; 359/291; 359/292; 359/298; 359/318; 345/85; 345/108; 345/211; 348/770; 348/771

(58) Field of Classification Search .................. 359/223, 359/224, 290–292, 295, 298, 318; 345/55, 345/85, 108, 205, 206, 211–215; 348/770, 348/771
See application file for complete search history.

(56) References Cited

U.S. PATENT DOCUMENTS

| 6,549,694 B2 | 4/2003 | Makino |
| 6,969,635 B2 | 11/2005 | Patel et al. |
| 7,027,284 B2 | 4/2006 | Kobayashi |
| 7,280,014 B2 | 10/2007 | Potter |
| 7,372,613 B2 * | 5/2008 | Chui et al. ............... 359/290 |
| 2007/0075942 A1 | 4/2007 | Martin et al. |
| 2008/0247028 A1 | 10/2008 | Chui et al. |

FOREIGN PATENT DOCUMENTS

| EP | 1093142 A2 | 4/2001 |
| WO | 2008/057228 | 5/2008 |
| WO | 2011/034820 | 3/2011 |

OTHER PUBLICATIONS

Touati, S., et al., "Low Actuation Voltage Totally Free Flexible RF MEMS Switch With Antistiction System," Design, Test, Integration and Packaging of MEMS/MOEMS (DTIP), Apr. 2008, pp. 66-70.
International Search Report and Written Opinion dated Feb. 4, 2011, from Application No. PCT/US2010/048662.

* cited by examiner

*Primary Examiner* — Evelyn A. Lester
(74) *Attorney, Agent, or Firm* — Weaver Austin Villeneuve & Sampson LLP

(57) ABSTRACT

Anti-stiction systems may include one or more anti-stiction electrodes driven to provide an electrical force that counteracts a stiction force acting upon a moveable portion of an interferometric modulator. The anti-stiction electrode(s) may be disposed on a back glass or on another such substrate. The anti-stiction electrode(s) may be configured to apply an electrical force to substantially all of the interferometric modulators in a display device at once and/or may be configured to apply an electrical force only to a selected area. In some embodiments, the sum of an anti-stiction electrical force and a mechanical restoring force of a moveable part of an interferometric modulator is sufficient to counteract a stiction force.

22 Claims, 17 Drawing Sheets

ANTI-STICTION ELECTRODE

FIELD OF THE INVENTION

This application relates generally to display technology and more specifically to displays involving microelectromechanical systems ("MEMS").

DESCRIPTION OF RELATED TECHNOLOGY

MEMS devices include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator.

When two surfaces having areas below the micrometer range come into close proximity (such as some embodiments of the interferometric modulator plates described above), they may adhere to one another. At such scales, electrostatic, van der Waals and hydrogen bonding forces can become significant. The phenomenon of two surfaces being held together by such forces is sometimes referred to as "stiction." Stiction may, in some instances, interfere with the desired operation of MEMS devices, including but not limited to interferometric modulators. It would be desirable to provide improved methods and devices that can address such issues.

SUMMARY

Improved anti-stiction devices and methods are provided herein. In various embodiments described herein, one or more electrodes are driven to exert an "anti-stiction" force that counteracts a stiction force. In some such embodiments, one or more anti-stiction electrodes are driven to provide an electrical force that counteracts a stiction force acting upon a moveable portion or "mechanical layer" of an interferometric modulator. The anti-stiction electrodes may, for example, be disposed on a "back glass" or other such structure that is not part of an interferometric modulator array.

The anti-stiction electrodes and the driving mechanisms may vary in complexity according to the implementation. For example, some embodiments involve driving a single anti-stiction electrode to apply an electrical force to substantially all of the interferometric modulators in a display device at substantially the same time. Alternative embodiments may be configured to apply anti-stiction electrical forces only to a selected portion of the interferometric modulators in a display device.

Some embodiments described herein include an apparatus comprising a first substantially transparent substrate and an array of interferometric modulation elements disposed on the first substantially transparent substrate. The interferometric modulation elements may comprise two layers that define a cavity, including a first layer that is movable relative to a second layer through a range of positions, causing the cavity to operate interferometrically in at least one of the positions and producing at least one predetermined optical response to visible light. The apparatus may include a first plurality of electrodes configured for conducting electrical signals to the array of interferometric modulation elements and first control circuitry configured to apply electrical signals for controlling the array of interferometric modulation elements via the first plurality of electrodes. The apparatus may also include a second substrate, a second plurality of electrodes disposed on the second substrate and second control circuitry. The second control circuitry may be configured to apply a voltage pulse sufficient to exert an electric force on the first layer that is sufficient to overcome a stiction force between the first layer and the second layer.

The first substantially transparent substrate may be on a first side of the movable layer and the second substrate may be on a second and opposing side of the movable layer. The interferometric modulation elements may provide a mechanical force that tends to separate the first layer from the second layer. The sum of the mechanical force and the electric force may be made greater than or equal to the stiction force.

In some embodiments, the second plurality of electrodes may be patterned into rows and columns on the second substrate. The second control circuitry may be configured to apply the voltage pulse to a selected area of the second plurality of electrodes. Alternatively, or additionally, the second control circuitry may be configured to apply the voltage pulse simultaneously to substantially all of the second plurality of electrodes.

The apparatus may also include a logic system configured to control the first and/or the second control circuitry. The logic system may comprise at least one processor, programmable logic device, etc. The logic system may be configured to determine stiction areas of interferometric modulation elements. The logic system may be further configured to control the second control circuitry to apply voltage pulses in areas of the second plurality of electrodes that correspond with the stiction areas. The stiction areas may, for example, be determined according to detected changes in capacitance. The second control circuitry may be configured to apply a voltage pulse to areas of the second plurality of electrodes corresponding to first portions of the first layer that are adjacent to second portions of the first layer that contact the second layer. The logic system may include a first logic device that controls the first control circuitry and a second logic device that controls the second control circuitry. Alternatively, the same logic device may control the first and second control circuitry. Moreover, the first and second control circuitry may be part of the logic system.

The second control circuitry may or may not be configured to apply voltage pulses that are synchronized with the electrical signals of the first plurality of electrodes. In some embodiments, the second control circuitry is configured to apply at least some voltage pulses that are asynchronous with the electrical signals of the first plurality of electrodes.

The apparatus may also include the following elements: a display; a processor that is configured to communicate with the display, the processor being configured to process image data; and a memory device that is configured to communicate with the processor. The apparatus may include a driver circuit configured to send at least one signal to the display. The apparatus may include a controller configured to send at least a portion of the image data to the driver circuit.

The apparatus may also comprise an image source module configured to send the image data to the processor. The image source module may include at least one of a receiver, a transceiver or a transmitter. The apparatus may include an input device configured to receive input data and to communicate the input data to the processor.

Alternative devices provided herein may include the following: a first substantially transparent substrate; interferometric modulation apparatus for producing a predetermined optical response to visible light, the interferometric modulation apparatus being disposed on the first substantially transparent substrate and comprising a first layer configured to be movable relative to a second layer; a second substrate; and anti-stiction apparatus disposed, at least in part, on the second substrate and configured to exert an electric force on the first layer that is sufficient to overcome a stiction force between the first layer and the second layer. The interferometric modulation apparatus may provide a mechanical force that tends to separate the first layer from the second layer. The sum of the mechanical force and the electric force may be made greater than or equal to the stiction force.

The anti-stiction apparatus may comprise a plurality of electrodes. The anti-stiction apparatus may be configured to apply a voltage pulse to a selected area of the plurality of electrodes. The anti-stiction apparatus may comprise a single electrode disposed on the second substrate. Some such devices may also include apparatus for determining stiction areas of the interferometric modulation means. The anti-stiction apparatus may or may not be configured to apply first voltage pulses that are synchronized with second voltage pulses of the interferometric modulation means.

Various methods are also provided herein. Some such methods include the step of forming an array of interferometric modulation elements on a first substrate. The array of interferometric modulation elements may be configured for producing a predetermined optical response to visible light. Each of the interferometric modulation elements may comprise a first layer configured to be movable relative to a second layer. Some such methods may also include the following steps: disposing an anti-stiction electrode system on a second substrate; attaching the first substrate to the second substrate; and configuring the anti-stiction electrode system to exert an electric force on the first layer that is sufficient to overcome a stiction force between the first layer and the second layer.

The disposing process may comprise disposing a plurality of anti-stiction electrodes on the second substrate. Alternatively, the disposing process may comprise disposing a single anti-stiction electrode on the second substrate. The configuring process may involve configuring the anti-stiction electrode system to apply a voltage pulse to a selected area of the plurality of anti-stiction electrodes.

The methods may further comprise embedding desiccant in the second substrate prior to the disposing step. The methods may comprise etching the second substrate prior to the disposing step. The methods may involve forming a plurality of posts in the second substrate prior to the disposing process.

Alternative methods are provided herein. Some such methods also involve forming an array of interferometric modulation elements on a substrate. The array of interferometric modulation elements may be configured for producing a predetermined optical response to visible light. Each of the interferometric modulation elements may include a first layer configured to be movable relative to a second layer. Some such methods may also include the following steps: depositing sacrificial material on the array of interferometric modulation elements; disposing an anti-stiction electrode system on the sacrificial material; forming a packaging layer that encloses the anti-stiction electrode system and the sacrificial material; and releasing the sacrificial material. Alternatively, the anti-stiction electrode system may be formed on the sacrificial material and the packaging layer may be formed on the anti-stiction electrode system, the sacrificial material and the substrate.

The methods may also involve configuring the anti-stiction electrode system to exert an electric force on the first layer that is sufficient to overcome a stiction force between the first layer and the second layer. The methods may also involve sealing the packaging layer after the releasing step. Some such methods may also involve depositing desiccant material, e.g., on the substrate.

These and other methods of the invention may be implemented by various types of hardware, software, firmware, etc. For example, some features of the invention may be implemented, at least in part, by computer programs embodied in machine-readable media. The computer programs may, for example, include instructions for controlling one or more devices to fabricate a device as described herein. Alternatively, the computer programs may include instructions for operating, at least in part, the devices described herein. Such computer programs may include instructions for driving one or more anti-stiction electrodes.

DETAILED DESCRIPTION

Figure 1:
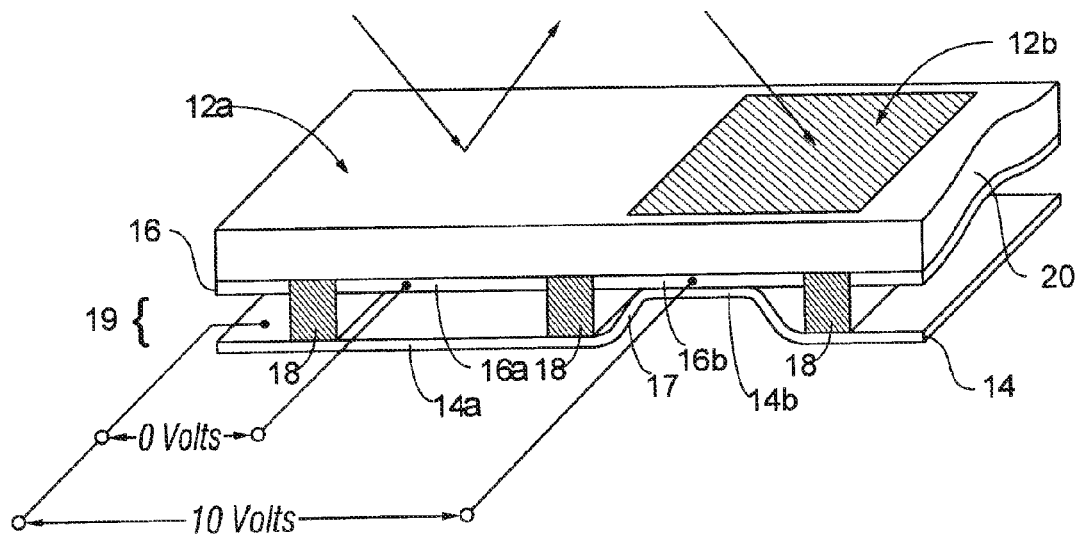
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

While the present invention will be described with reference to a few specific embodiments, the description and specific embodiments are merely illustrative of the invention and are not to be construed as limiting the invention. Various modifications can be made to the described embodiments without departing from the true spirit and scope of the invention as defined by the appended claims. For example, the steps of methods shown and described herein are not necessarily performed in the order indicated. It should also be understood that the methods of the invention may include more or fewer steps than are indicated. In some implementations, steps described herein as separate steps may be combined. Conversely, what may be described herein as a single step may be implemented in multiple steps.

Similarly, device functionality may be apportioned by grouping or dividing tasks in any convenient fashion. For example, when steps are described herein as being performed by a single device (e.g., by a single logic device), the steps may alternatively be performed by multiple devices and vice versa. Moreover, the specific materials, dimensions, etc., described herein are provided merely by way of example and are in no way limiting. The drawings referenced herein are not necessarily drawn to scale.

Some interferometric modulators described herein include mechanical layers (also referred to herein as moveable layers or the like) that are moved to a closed position when an actuation voltage is applied, but which normally return to an open position when the actuation voltage is reduced below a predetermined threshold. The mechanical layer may normally return to the open position due to a mechanical restoring force of the mechanical layer itself, which is analogous to the restoring force that tends to return a spring to its relaxed state. Sometimes, however, the restoring force is not large enough to overcome stiction.

Some anti-stiction systems described herein may include one or more electrodes driven to provide an electrical force that counteracts a stiction force acting upon a moveable portion of an interferometric modulator. The anti-stiction electrode(s) may be disposed on a back glass or on another such substrate. The anti-stiction electrode(s) may be configured to apply an electrical force to substantially all of the interferometric modulators in a display device at once and/or may be configured to apply an electrical force only to a selected area. In some embodiments, the sum of an anti-stiction electrical force and a mechanical restoring force of a moveable part of an interferometric modulator is sufficient to counteract a stiction force and release the mechanical layer.

FIGS. 1 through 7E illustrate some examples of interferometric modulators, their functions and their uses. These figures will be described first and thereafter some examples of anti-stiction systems and methods will be described with reference to FIG. 8 et seq.

The embodiments described herein may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

One interferometric modulator display embodiment comprising an interferometric MEMS display element is illustrated in FIG. 1. In these devices, the pixels are in either a bright or dark state. In the bright ("relaxed" or "open") state, the display element reflects a large portion of incident visible light to a user. When in the dark ("actuated" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical gap with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14 is illustrated in a relaxed position 14a at a predetermined distance from an optical stack 16a, which includes a partially reflective layer. In the interferometric modulator 12b on the right, the movable reflective layer 14 is illustrated in an actuated position 14b adjacent to the optical stack 16b.

The optical stacks 16a and 16b (collectively referred to as optical stack 16), as referenced herein, typically comprise several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack 16 are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) to form columns deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device. Note that FIG. 1 may not be to scale. In some embodiments, the spacing between posts 18 may be on the order of 10-100 um, while the gap 19 may be on the order of <1000 Angstroms.

With no applied voltage, the gap 19 remains between the movable reflective layer 14a and optical stack 16a, with the movable reflective layer 14a in a mechanically relaxed state, as illustrated by the pixel 12a in FIG. 1. However, when a potential (voltage) difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by actuated pixel 12b on the right in FIG. 1. The behavior is the same regardless of the polarity of the applied potential difference.

FIGS. 2 through 5 illustrate one exemplary process and system for using an array of interferometric modulators in a display application.

Figure 2:
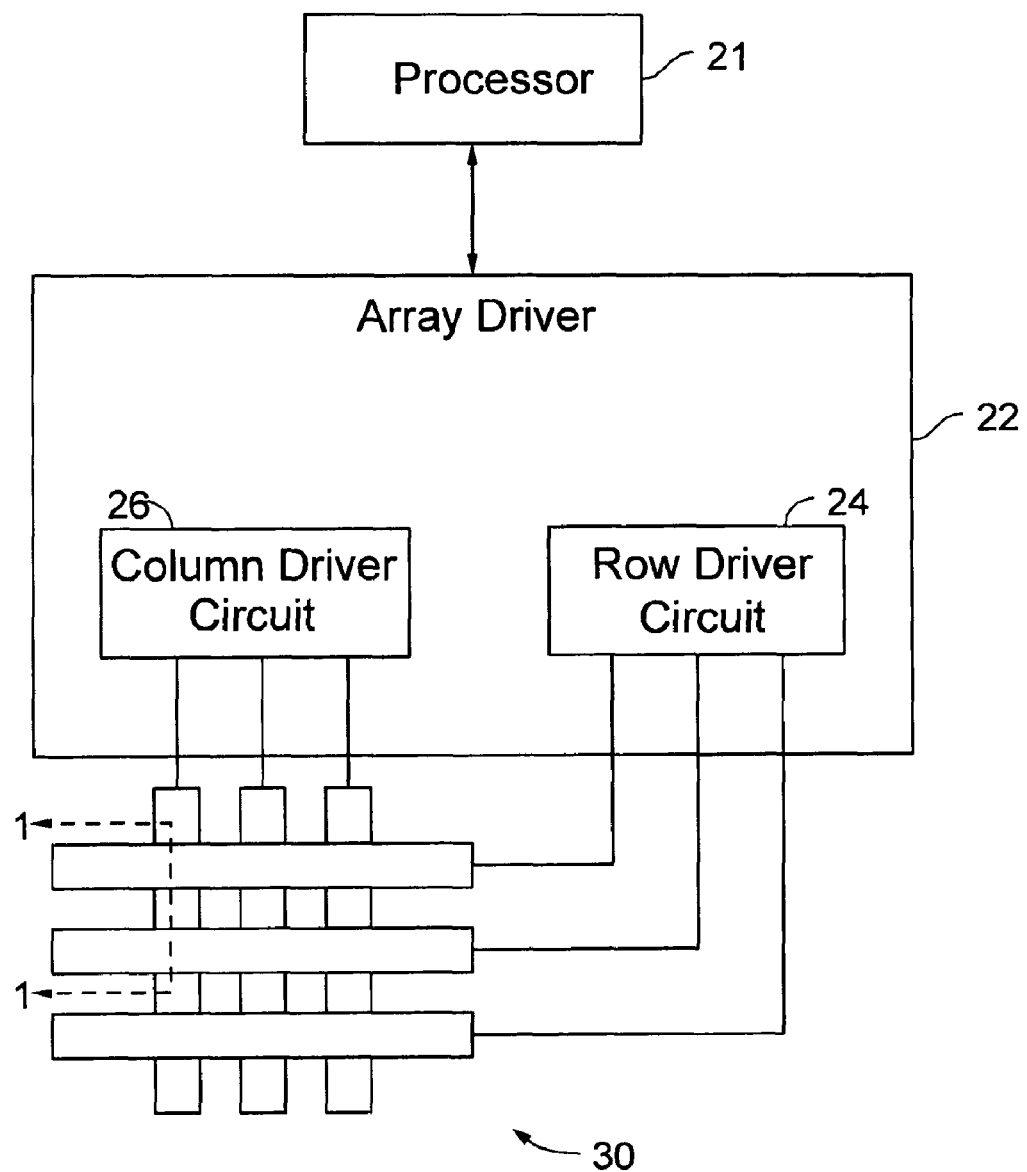
FIG. 2 is a system block diagram illustrating one embodiment of an electronic device incorporating a 3×3 interferometric modulator display.

FIG. 2 is a system block diagram illustrating one embodiment of an electronic device that may incorporate interferometric modulators. The electronic device includes a processor 21 which may be any general purpose single- or multi-chip microprocessor such as an ARM®, Pentium®, 8051, MIPS®, Power PC®, or ALPHA®, or any special purpose microprocessor such as a digital signal processor, microcontroller, or a programmable gate array. Processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. Processor 21 and array driver 22 may sometimes be referred to herein as being "logic devices" and/or part of a "logic system." The cross section of the array illustrated in FIG. 1 is shown by the lines 1-1 in FIG. 2. Note that although FIG. 2 illustrates a 3×3 array of interferometric modulators for the sake of clarity, the display array 30 may contain a very large number of interferometric modulators, and may have a different number of interferometric modulators in rows than in columns (e.g., 300 pixels per row by 190 pixels per column).

Figures 3, 4:
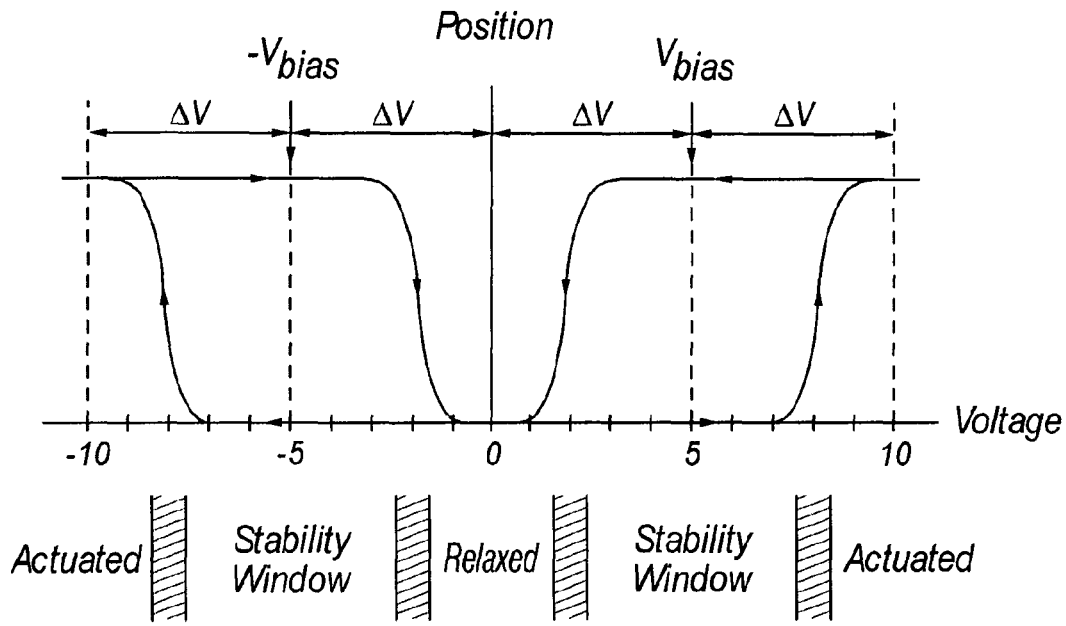
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.

FIG. 3 is a diagram of movable mirror position versus applied voltage for one exemplary embodiment of an interferometric modulator of FIG. 1. For MEMS interferometric modulators, the row/column actuation protocol may take advantage of a hysteresis property of these devices as illustrated in FIG. 3. An interferometric modulator may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state or bias voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

As described further below, in typical applications, a frame of an image may be created by sending a set of data signals (each having a certain voltage level) across the set of column electrodes in accordance with the desired set of actuated pixels in the first row. A row pulse is then applied to a first row electrode, actuating the pixels corresponding to the set of data signals. The set of data signals is then changed to correspond to the desired set of actuated pixels in a second row. A pulse is then applied to the second row electrode, actuating the appropriate pixels in the second row in accordance with the data signals. The first row of pixels are unaffected by the second row pulse, and remain in the state they were set to during the first row pulse. This may be repeated for the entire series of rows in a sequential fashion to produce the frame. Generally, the frames are refreshed and/or updated with new image data by continually repeating this process at some desired number of frames per second. A wide variety of protocols for driving row and column electrodes of pixel arrays to produce image frames may be used.

FIGS. 4 and 5 illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to −Vbias, and the appropriate row to +ΔV, which may correspond to −5 volts and +5 volts respectively Relaxing the pixel is accomplished by setting the appropriate column to +Vbias, and the appropriate row to the same +ΔV, producing a zero volt potential difference across the pixel. In those rows where the row voltage is held at zero volts, the pixels are stable in whatever state they were originally in, regardless of whether the column is at +Vbias, or −Vbias. As is also illustrated in FIG. 4, voltages of opposite polarity than those described above can be used, e.g., actuating a pixel can involve setting the appropriate column to +Vbias, and the appropriate row to −ΔV. In this embodiment, releasing the pixel is accomplished by setting the appropriate column to −Vbias, and the appropriate row to the same −ΔV, producing a zero volt potential difference across the pixel.

Figure 5A:
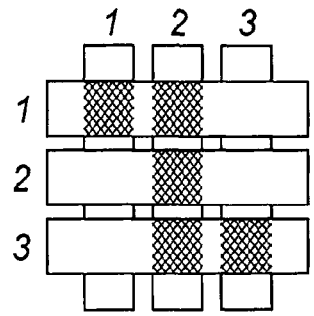
FIGS. 5A and 5B illustrate one exemplary timing diagram for row and column signals that may be used to write a frame of display data to the 3×3 interferometric modulator display of FIG. 2.
Figure 5B:
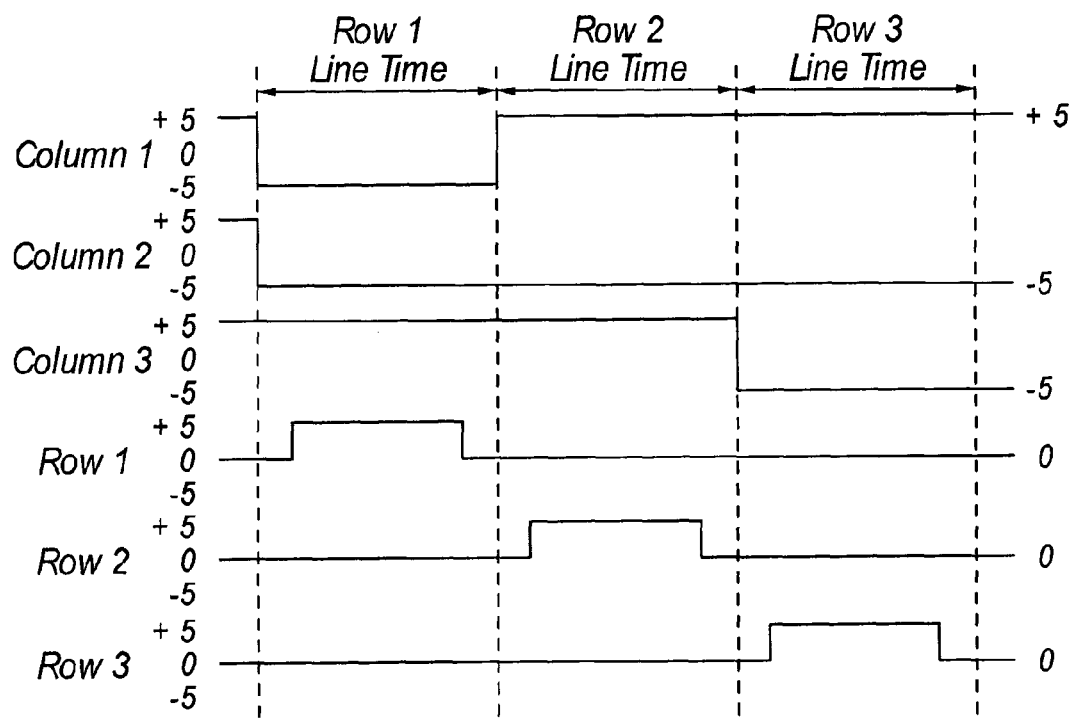

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are initially at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. The same procedure can be employed for arrays of dozens or hundreds of rows and columns. The timing, sequence, and levels of voltages used to perform row and column actuation can be varied widely within the general principles outlined above, and the above example is exemplary only, and any actuation voltage method can be used with the systems and methods described herein.

Figure 6A:
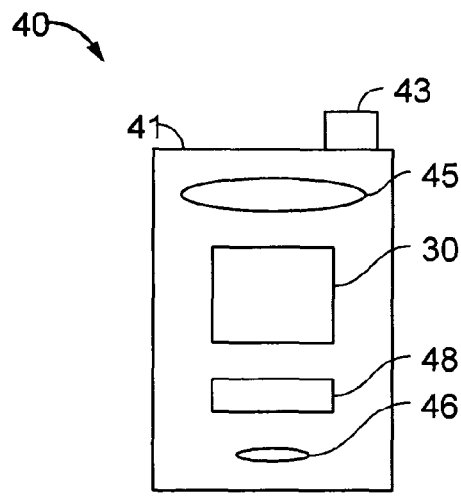
FIGS. 6A and 6B are system block diagrams illustrating an embodiment of a visual display device comprising a plurality of interferometric modulators.
Figure 6B:
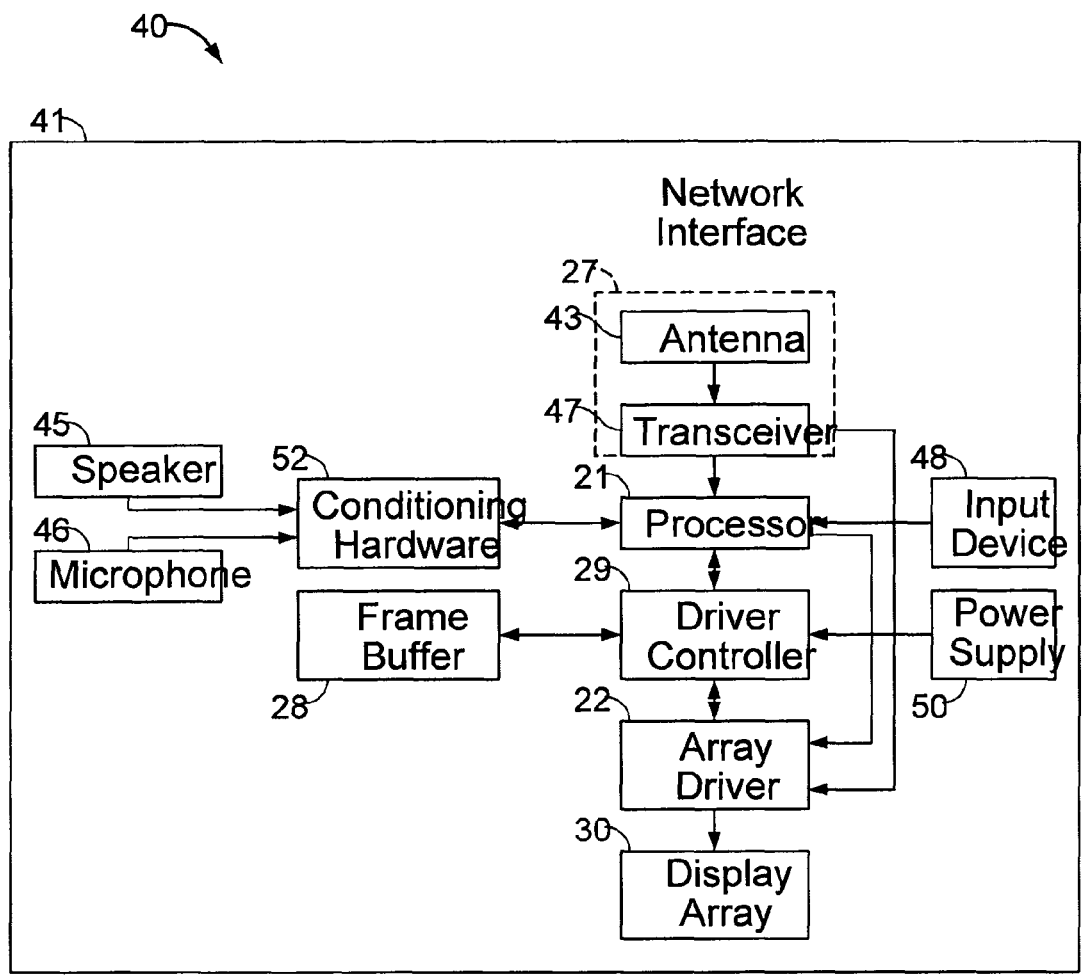

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. Conditioning hardware 52 and/or driver controller 29 may sometimes be referred to herein as part of the logic system. A power supply 50 provides power to all components as required by the particular exemplary display device 40 design.

The network interface 27 includes the antenna 43 and the transceiver 47 so that the exemplary display device 40 can communicate with one or more devices over a network. In one embodiment the network interface 27 may also have some processing capabilities to relieve requirements of the processor 21. The antenna 43 is any antenna for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS, W-CDMA, or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or other logic device to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. For example, they may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. The above-described optimization may be implemented in any number of hardware and/or software components and in various configurations.

Figure 7A:
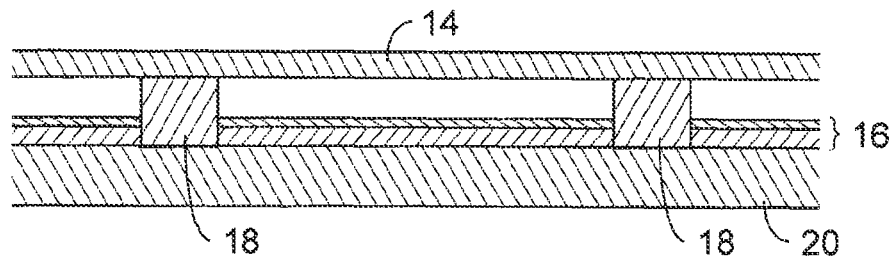
FIG. 7A is a cross section of the device of FIG. 1.
Figure 7B:
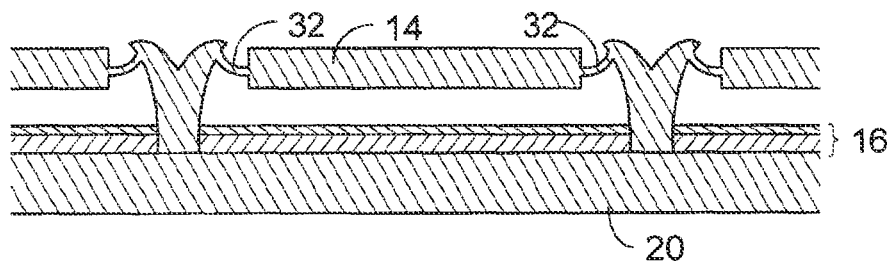
FIG. 7B is a cross section of an alternative embodiment of an interferometric modulator.
Figure 7C:
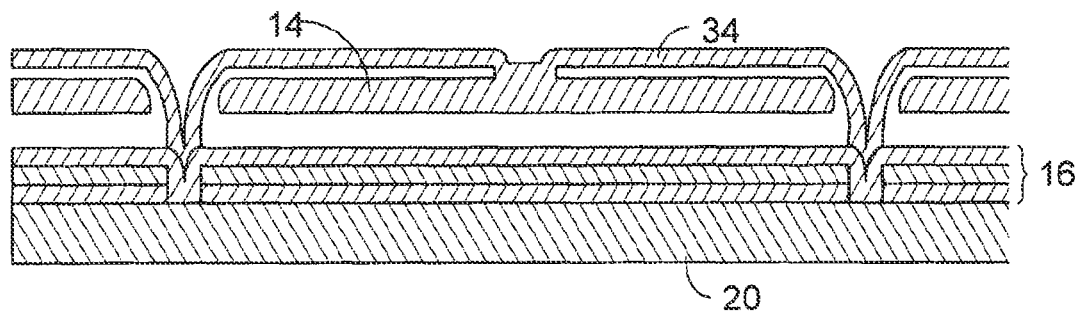
FIG. 7C is a cross section of another alternative embodiment of an interferometric modulator.
Figure 7D:
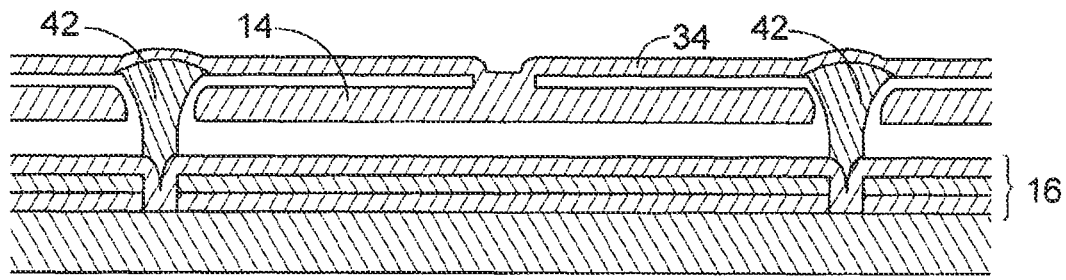
FIG. 7D is a cross section of yet another alternative embodiment of an interferometric modulator.
Figure 7E:
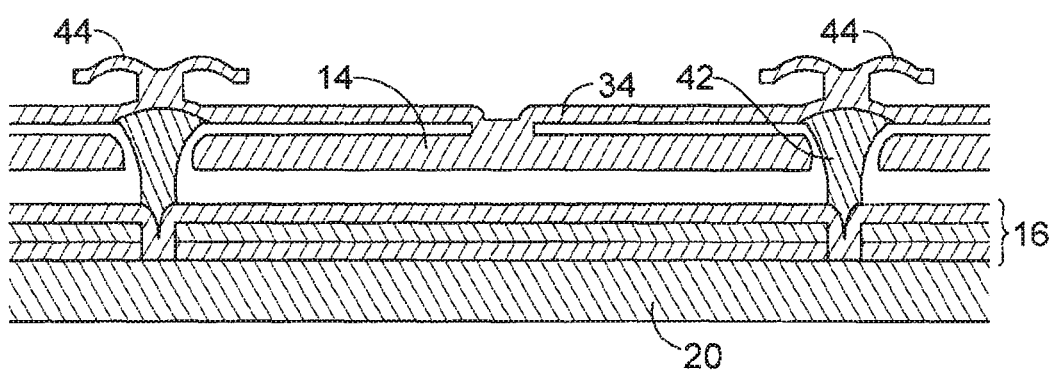
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and their supporting structures. FIG. 7A is a cross section of the embodiment of FIG. 1, where a strip of metal material 14 is deposited on orthogonally extending supports 18. In FIG. 7B, the moveable reflective layer 14 of each interferometric modulator is square or rectangular in shape and attached to supports at the corners only, on tethers 32. In FIG. 7C, the moveable reflective layer 14 is square or rectangular in shape and suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the gap, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. For example, such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Whatever the design, the function of interferometric modulators and other MEMS devices may sometimes be impaired due to stiction. Therefore, improved anti-stiction devices and methods are provided herein. In various embodiments, one or more electrodes may be driven to exert a force that counteracts a stiction force. In some such embodiments, one or more anti-stiction electrodes are driven to provide an electrical force that counteracts a stiction force acting upon a moveable portion of an interferometric modulator. Movable reflective layer 14 of FIG. 1 is one example of such a moveable portion. The anti-stiction electrodes may, for example, be disposed on a "back glass" or other such structure that is not part of an interferometric modulator array.

Figure 8:
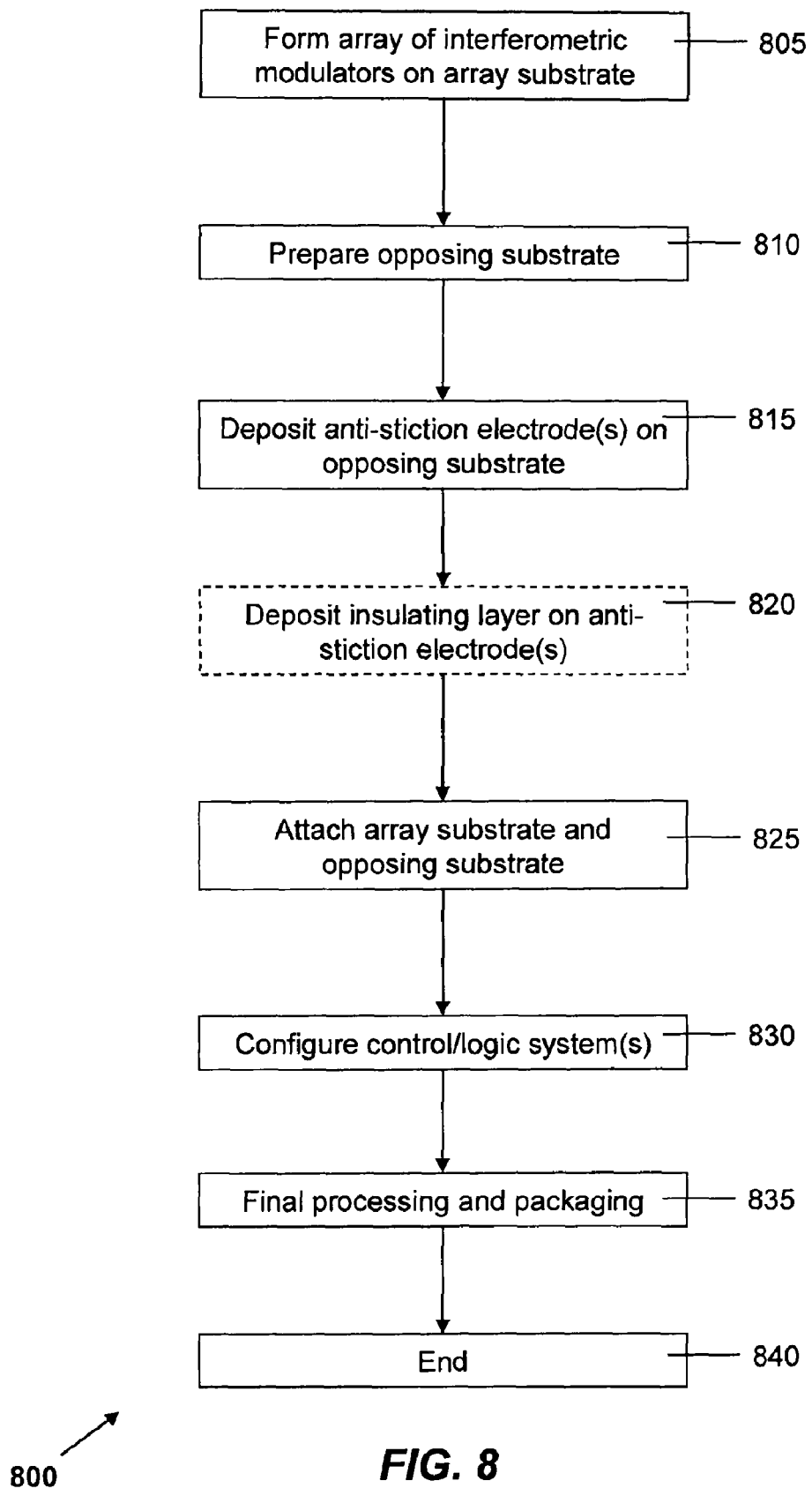
FIG. 8 is a flow chart that sets forth steps of device fabrication according to some implementations described herein.

FIG. 8 is a flow chart that outlines steps of forming a device that includes an interferometric modulator array and an anti-stiction system. Method 800 starts with step 805, in which an array of interferometric modulators is formed on a first substrate. This process may, for example, involve steps, materials and configurations substantially as described above with reference to FIGS. 1 through 7E, or may involve other processes and materials. The first substrate is referenced in FIG. 8 as an "array substrate" in order to distinguish it from the opposing substrate on which at least a portion of the anti-stiction system is formed, according to this example.

In step 810, the opposing substrate is prepared. Step 810 may involve, for example, cleaning, etching or other processes. In some embodiments, step 810 involves altering a surface of the opposing substrate in order to reduce the gap between the opposing substrate and the array substrate when the two substrates are attached. (Step 825.) For example, one or more recesses may be etched into the opposing substrate. The recesses may be configured to receive, at least in part, the anti-stiction electrode(s).

Alternatively, or additionally, step 810 may involve physical abrasion of the opposing substrate, e.g., by "sandblasting" the opposing substrate with particles. In some such implementations, step 810 may involve sandblasting the opposing substrate with desiccant particles. Such processes can result in a relatively smaller gap between the opposing substrate and the array substrate, as compared to alternative methods wherein desiccant material is formed on the surface of the opposing substrate facing the array substrate.

Figure 9A:
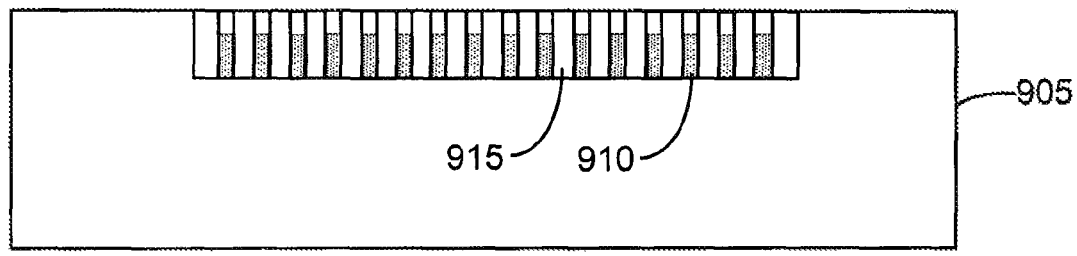
FIG. 9A is a cross-section of posts in a backglass according to some embodiments described herein.
Figure 9B:
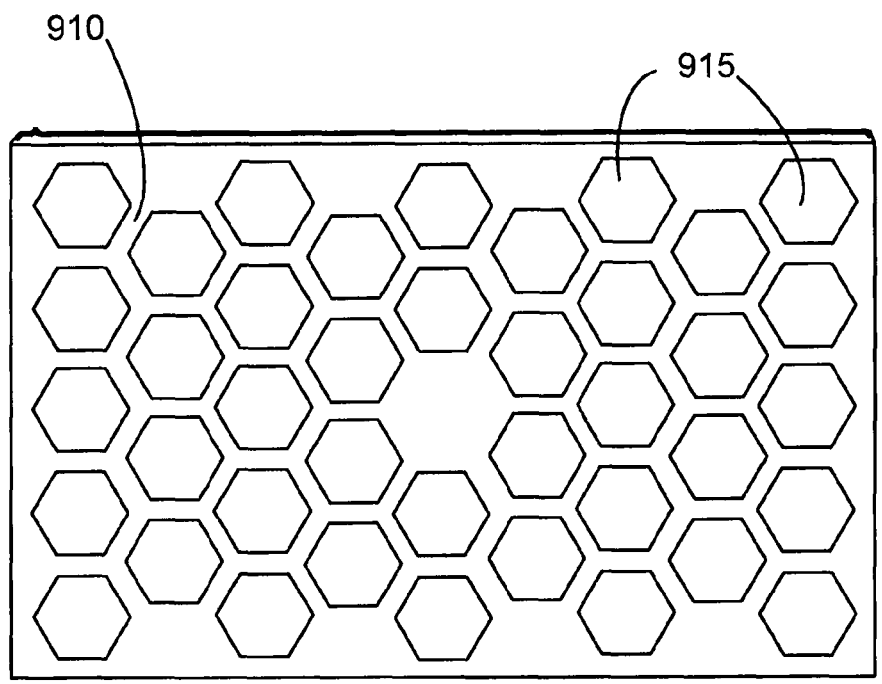
FIG. 9B is a top view of the posts of FIG. 9A according to some embodiments described herein.

One such embodiment is depicted in FIGS. 9A and 9B. FIG. 9A is a cross-section through substrate 905. In this example, substrate 905 is formed of glass. However, in alternative embodiments, substrate 905 may be formed of one or more other materials, such as acrylic, plastic, ceramic, metal, etc. Substrate 905 has been sandblasted to form recesses 910, which include desiccant material, and posts 915. According to some embodiments, posts 915 may be used as support structures on which one or more anti-stiction electrodes may be formed. (See step 815 of FIG. 8.)

As noted in the top view shown in FIG. 9B, in this example posts 915 are hexagonal in cross-section and are depicted as occupying more area than recesses 910. However, in alternative embodiments posts 915 may be formed into other shapes. For example, posts 915 may be circular, oval, square, rectangular, triangular, etc., in cross-section. Moreover, in alternative embodiments recesses 910 may occupy as much area as, or more area than, posts 910.

The anti-stiction electrode(s) and/or the corresponding driving mechanisms may vary in complexity according to the implementation, as described in detail below. Therefore, the process of depositing the anti-stiction electrode(s) in step 815 may vary accordingly.

Figure 10A:
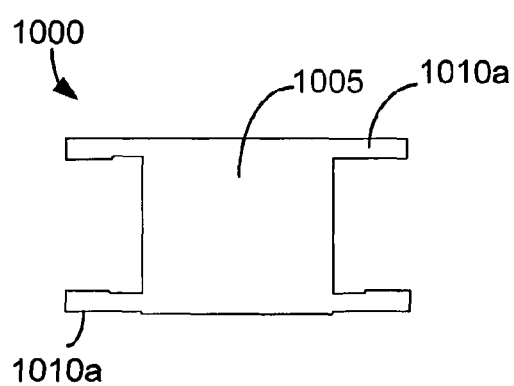
FIGS. 10A through 10D are simplified diagrams of anti-stiction electrodes according to some embodiments described herein.

For example, step 815 may involve forming a single anti-stiction electrode on the substrate. Examples are provided in FIGS. 10A and 10B. Referring first to FIG. 10A, anti-stiction electrode 1000 includes plate 1005 and connectors 1010a. In this example, the area of plate 1005 is approximately the same as that of an interferometric modulator array that has been formed, or will be formed, on an array substrate. In a device that includes anti-stiction electrode 1000 and the interferometric modulator array, plate 1005 may be disposed opposite the interferometric modulator array and separated by a small gap. (Some examples are described below with reference to FIGS. 12 and 13.) Accordingly, when sufficient voltage is applied to plate 1005, an anti-stiction force may be exerted on substantially all of the interferometric modulators in the corresponding interferometric modulator array. Connectors 1010a may extend beyond the corresponding area of the interferometric modulator array to provide convenient electrical connectivity, e.g., with an electrical routing area of the device.

Figure 10B:
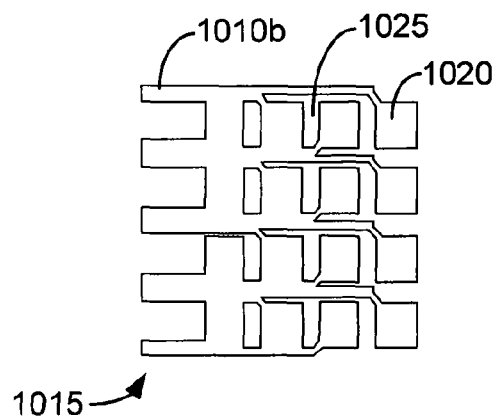

Referring now to FIG. 10B, anti-stiction electrode 1015 includes connectors 1010b and a plurality of rectangular areas 1020. In this example, some of rectangular areas 1020 are contiguous and others are not. Accordingly, there are gaps 1025 between portions of anti-stiction electrode 1015 wherein the corresponding portion of the opposing substrate is not covered. Nonetheless, in this example all of the rectangular areas 1020 of anti-stiction electrode 1015 are electrically connected and can be driven at substantially the same time. Therefore, when sufficient voltage is applied, anti-stiction electrode 1015 can exert an anti-stiction electrical force on most (or, in some implementations, substantially all) of the interferometric modulators in the corresponding interferometric modulator array.

Alternative embodiments may be configured to apply anti-stiction electrical forces only to a selected portion of the interferometric modulators in an array of interferometric modulators. According to some such embodiments, anti-stiction forces may be applied to a portion of an interferometric modulator array in which stiction has been detected. Stiction may be detected, for example, by measuring the difference in capacitance between that of an interferometric modulator that is in an inactivated position and that of an interferometric modulator that remains in an activated position due to stiction. In alternative embodiments, anti-stiction forces may be applied to areas of an interferometric modulator array in a predetermined sequence and/or at predetermined times and not necessarily in response to detecting stiction problems.

Figure 10C:
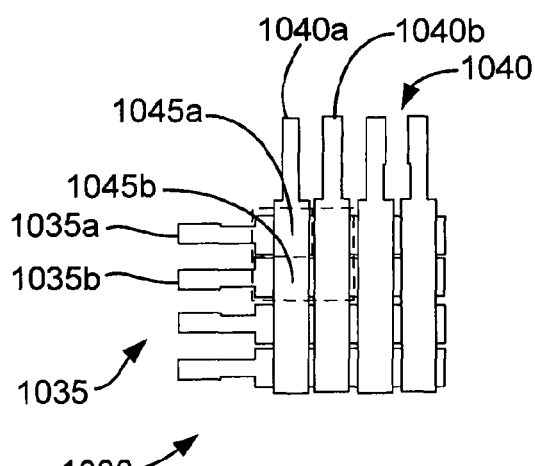

Referring now to FIG. 10C, anti-stiction electrode system 1030 provides one example of an embodiment configured to apply anti-stiction electrical forces only to a selected portion of the interferometric modulators in an array. Anti-stiction electrode system 1030 includes row electrodes 1035 and column electrodes 1040. When row electrode 1035a and column electrode 1040a are both driven, an anti-stiction electrical force is applied in area 1045a. When row electrodes 1035a and 1035b, as well as column electrodes 1040a and 1040b are all driven, an anti-stiction electrical force is applied in area 1045b. Although only 4 row electrodes 1035 and four column electrodes 1040 are depicted in FIG. 10C, alternative embodiments may have more or fewer row electrodes 1035 and column electrodes 1040. For example, alternative embodiments may include tens, hundreds, thousands or more of row electrodes 1035 and/or column electrodes 1040.

Although row electrodes 1035 and column electrodes 1040 are separately addressable, in alternative embodiments at least some of row electrodes 1035 or column electrodes 1040 may not be separately addressable. Moreover, although row electrodes 1035 and column electrodes 1040 are depicted as being substantially uniform, in alternative embodiments at least some of row electrodes 1035 or column electrodes 1040 may vary in shape. For example, some of row electrodes 1035 or column electrodes 1040 may be wider than others.

Accordingly, various embodiments provided herein allow anti-stiction forces to be applied to interferometric modulator arrays to varying degrees of precision. Some such embodiments allow anti-stiction forces to be applied to relatively larger regions of an interferometric modulator array, e.g., to half of the array, to a quarter of the array, to an eighth, to a sixteenth, etc. However, some embodiments provided herein allow anti-stiction forces to be applied to interferometric modulator arrays in a more precisely controlled fashion. For example, some embodiments allow an anti-stiction force to be applied to a selected portion of one or more interferometric modulators. The selected portion of an IMOD may comprise, e.g., one or more sub-pixels of a single pixel. Alternatively, the selected portion of an IMOD may comprise a plurality of pixels.

Referring now to FIG. 1, some such embodiments are configured to exert an anti-stiction force on "bending region" 17 of movable reflective layer 14 so that movable reflective layer 14 may be peeled away from optical stack 16b. Depending on the configuration of the interferometric modulator and other factors, such precise application of anti-stiction forces may allow a smaller anti-stiction force—and therefore a smaller voltage—to be applied than if, e.g., anti-stiction forces were applied to the portions of movable reflective layer 14 that are adjacent to the optical stack 16b. In some such embodiments, for example, a row electrode 1035 or column electrode 1040 may be positioned near bending region 17 of movable reflective layer 14. For embodiments in which interferometric modulators are laid out in a grid, an anti-stiction system could be configured to apply anti-stiction forces to a column of interferometric modulators, to a row of interferometric modulators and/or to an individual interferometric modulator.

Figure 10D:
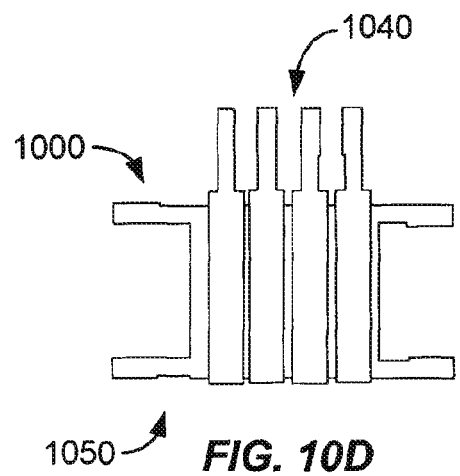

FIG. 10D depicts electrode system 1050, which includes plate electrode 1000 and column electrodes 1040. Electrode 1000 of electrode system 1050 may be driven to provide an anti-stiction force to substantially an entire array of interferometric modulators. Alternatively, column electrodes 1040 may be driven to apply an anti-stiction force to a corresponding area of interferometric modulators, which may include a single column of interferometric modulators or multiple columns of interferometric modulators.

Figure 11:
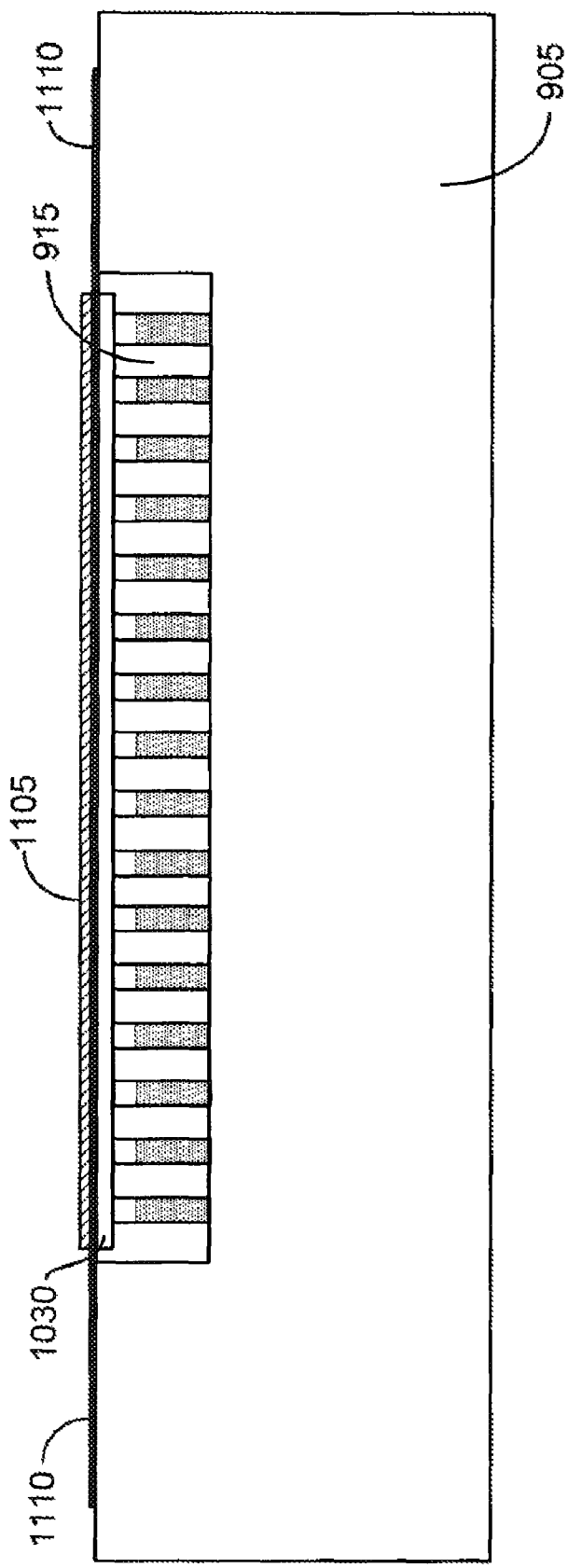
FIG. 11 is a cross-section of the posts of FIG. 9A with anti-stiction electrodes and insulating material deposited thereon, according to some embodiments described herein.

Referring again to FIG. 8, after the anti-stiction electrodes have been formed on the substrate, an insulating layer may be deposited on the anti-stiction electrodes in optional step 820. One example is shown in FIG. 11. Here, a cross-section through substrate 905, columns 915 and anti-stiction electrode array 1030 is shown. In this example, insulating layer 1105 has been deposited on anti-stiction electrode array 1030. Electrical connectors 1110 project outside the main portion of anti-stiction electrode array 1030 to provide a convenient manner of providing electrical connectivity between the anti-stiction electrode array and one or more drivers or other control circuitry.

Figure 12:
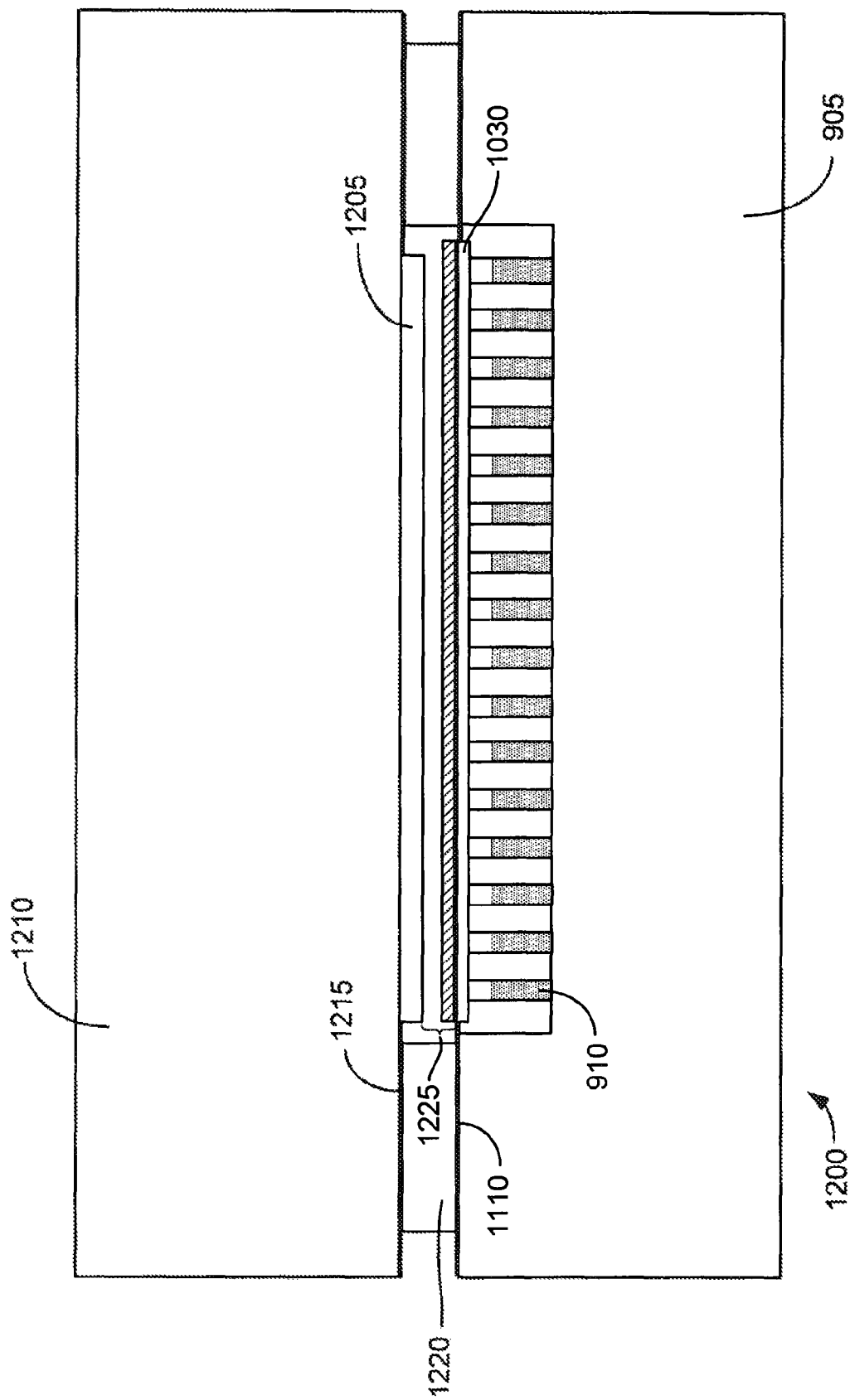
FIG. 12 depicts the assembly of FIG. 11 attached to an array substrate.
Figure 13:
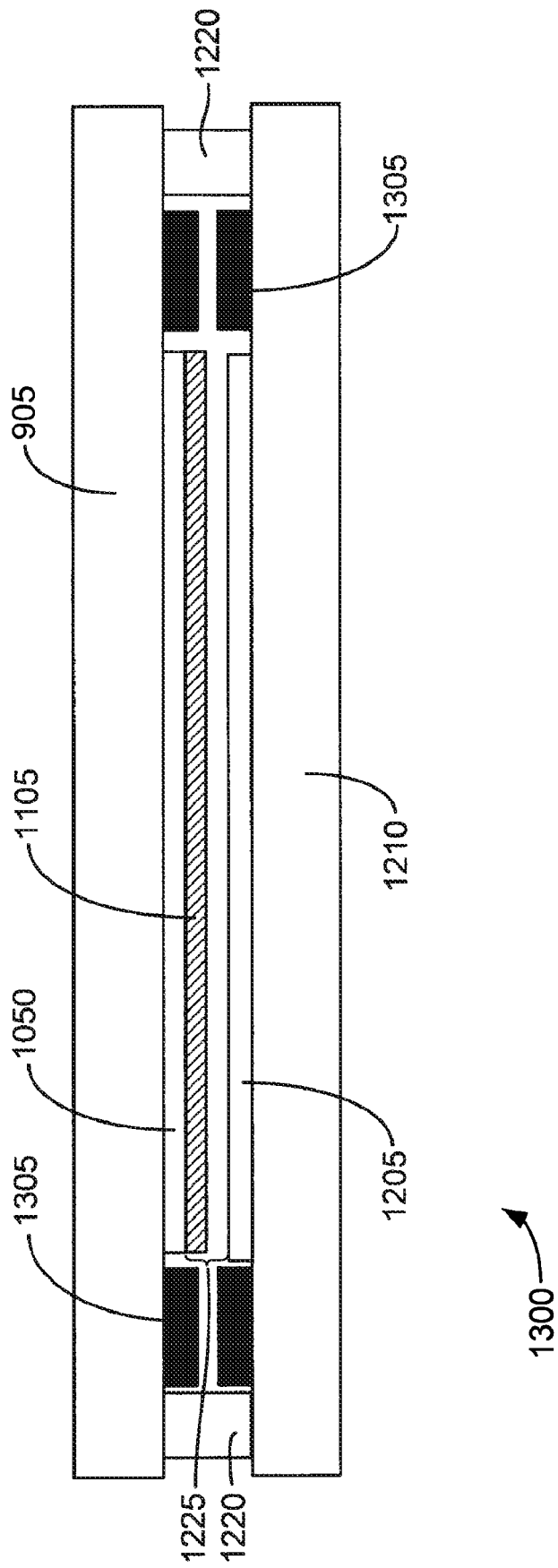
FIG. 13 depicts an alternative embodiment of a device that includes anti-stiction electrodes and an array substrate.

In this example, the array substrate is then attached to the opposing substrate. (See step 825 of FIG. 8.) FIG. 12 provides an example. Apparatus 1200 of FIG. 12 includes interferometric modulator array 1205, which is disposed on array substrate 1210. Routing connectors 1215 project outwards from interferometric modulator array 1205, providing electrical connectivity between interferometric modulator array 1205 and a routing area, drivers and/or other control circuitry. Adhesive material 1220, which is epoxy in this example, attaches substrates 905 and 1210.

It can be advantageous to make gap 1225, between interferometric modulator array 1205 and anti-stiction electrode array 1230, relatively small. Because the required actuation voltage is proportional to the square root of the gap size cubed, a smaller gap 1225 means that a smaller voltage will be required. Accordingly, some embodiments provided herein include devices having a gap 1225 on the order of 1 to 10 microns in size. Some such embodiments have a sufficiently small gap 1225 that the anti-stiction voltage applied by the anti-stiction electrodes to the moveable portion of the interferometric modulators may be in the range of 10 to 30 volts.

In the embodiment shown in FIG. 12, the embedded desiccant in recesses 910 helps to enable a relatively small gap 1225.

However, alternative embodiments provided herein can provide a sufficiently small gap size without embedded desiccant material. Device 1300 of FIG. 13, for example, includes desiccant patches 1305 disposed in an area adjacent to interferometric modulator array 1205 and anti-stiction electrode array 1050, yet inside the area defined by adhesive 1220 and substrates 905 and 1210. Such embodiments can provide a small enough gap 1225 to allow a sufficiently large anti-stiction force to be applied by the anti-stiction electrode(s) without an excessively high voltage requirement.

However, in some embodiments, gap 1225 may be larger than 10 microns. For example, in some embodiments gap 1225 between 10 microns and 20 microns, or even larger than 20 microns. For embodiments in which power consumption is not an important design issue, larger gaps and correspondingly larger voltages may be acceptable.

Figures 14A, 14B:
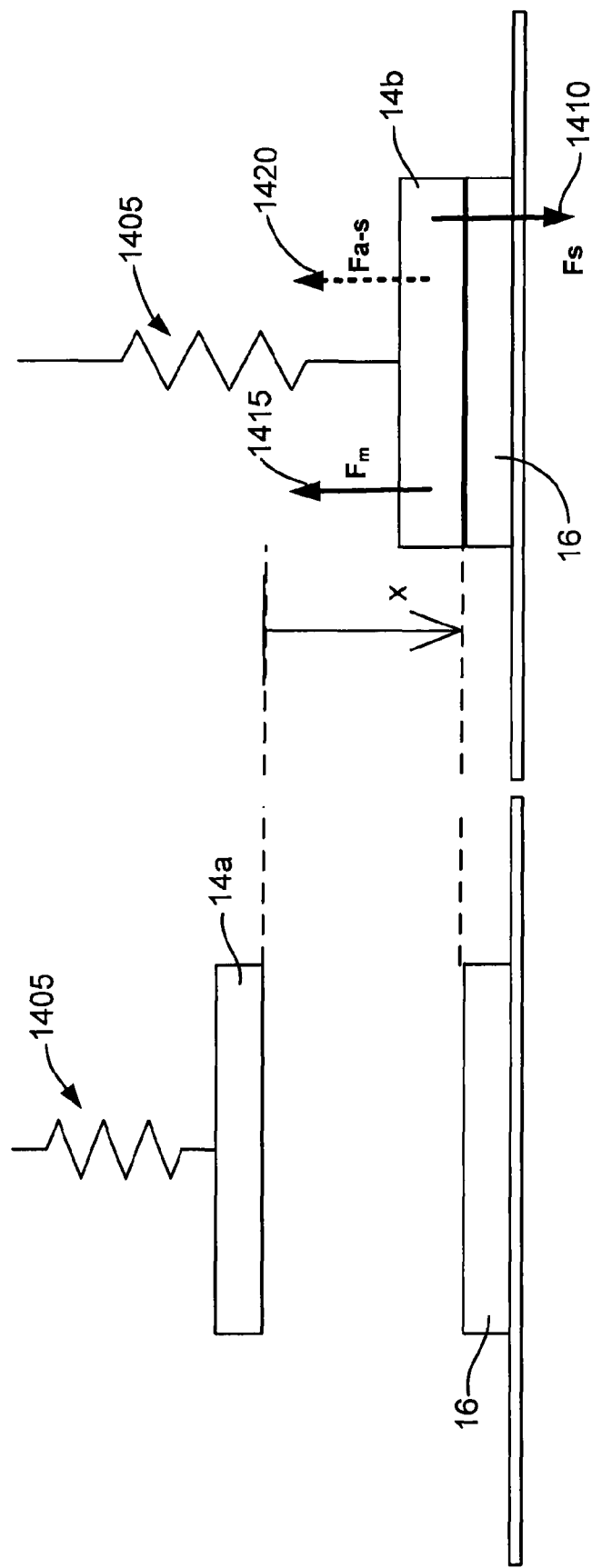
FIGS. 14A and 14B are diagrams that depict forces that can act upon a mirror and other parts of a mechanical layer according to some embodiments described herein.

Another factor that can reduce the required voltage applied to anti-stiction electrodes is the amount of restoring force that is supplied by the mechanical properties of some interferometric modulators. Referring now to FIG. 14A, moveable portion 14 is depicted in relaxed position 14a. This position corresponds to the relaxed position 14a described above with reference to FIG. 1. In this example, a distance x separates moveable portion 14 and optical stack 16.

Moveable portion 14 is driven through the distance x to position 14b, adjacent to optical stack 16, when an actuation voltage is applied between optical stack 16 and moveable portion 14. This condition is depicted in FIG. 14B. In this example, even after the actuation voltage is no longer being applied, stiction force 1410 between moveable portion 14 and optical stack 16 tends to keep moveable portion 14 adjacent to optical stack 16a.

Mechanical force 1415, sometimes referred to herein as a restoring force, exerts a force on moveable portion 14 that tends to move moveable portion away from optical stack 16. Mechanical force 1415 may be conceptualized as a force applied by a spring 1405, which represents the modulus of elasticity of the mechanical layer. In this simplified model, mechanical force 1415 would equal the product of the spring constant k of spring 405 and the distance x. Mechanical force 1415 may often be sufficient to overcome stiction force 1410 and to return moveable portion 14 to relaxed position 14a.

However, there may be instances in which mechanical force 1415 will not be sufficient to overcome stiction force 1410. In such instances, when a sufficiently strong anti-stiction force 1420 is applied to moveable portion 14, the sum of anti-stiction force 1420 and mechanical restoring force 1415 will be greater than stiction force 1410 and sufficient release moveable portion 14 from optical stack 16. Accordingly, anti-stiction force 1420 does not necessarily need to be greater than stiction force 1410. Moreover, the required magnitude of anti-stiction force 1420 (and therefore of the required voltage) may depend on the magnitude of mechanical restoring force 1415.

Referring again to FIG. 8, the control or logic system(s) may be configured in step 830. In some implementations, step 830 may involve providing one or more logic devices, such as processors, programmable logic devices, etc., that have already been configured to control an anti-stiction system. In other implementations, step 830 may involve providing or updating software of an existing logic device. Step 830 may involve providing a logic device that has already been configured to provide at least some of the functionality described herein, e.g., providing a programmable logic device so configured.

In any case, the logic system is preferably configured to control the voltage applied to the anti-stiction electrodes based, at least in part, on the restoring forces of the mechanical layers of the corresponding interferometric modulator array. Some mechanical layers are made "stiffer" than others and therefore have larger restoring forces. If these restoring forces are relatively larger, a correspondingly smaller anti-stiction force may be applied.

The complexity of the control system will depend, at least in part, on the complexity of the anti-stiction electrode array, whether the control system will detect and/or respond to stiction, etc. Depending on the embodiment, the logic device used to control the anti-stiction system may or may not be the same logic device that is used to control the array of interferometric modulators.

The final packaging and processing is accomplished in step 835. For example, the anti-stiction system and interferometric modulator system may be combined with other components to make a display device. The display device, in turn, may be combined with other components to form a mobile communication device or some other device. Additional packaging may be added for protection, advertising, shipping, etc. The process ends in step 840.

Some devices provided herein may be configured to apply more than one anti-stiction electrode driving algorithm. The algorithm that is applied may be changed, e.g., according to commands from a user and/or according to detected changes in conditions.

Figure 15:
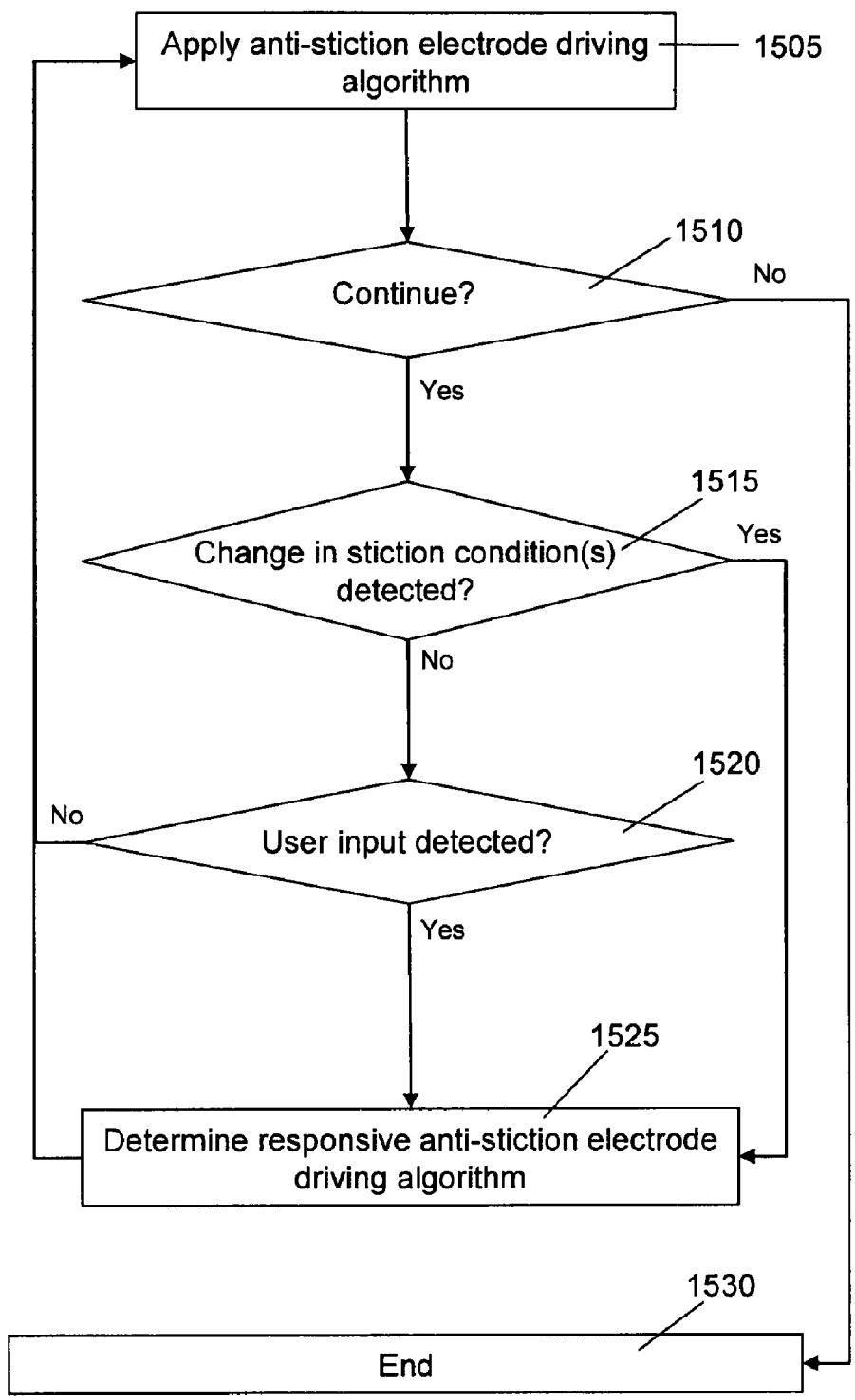
FIG. 15 is a flow chart that sets forth steps of device operation according to some implementations described herein.

The operation of some such devices will now be described with reference to FIG. 15. Method 1500 starts with step 1505, in which the anti-stiction electrodes of a device are being controlled according to a first anti-stiction electrode driving algorithm. According to the first anti-stiction electrode driving algorithm, voltage may be applied to the anti-stiction electrodes at a first predetermined frequency, in a first predetermined areal pattern, etc. For example, the first anti-stiction electrode driving algorithm may apply voltage to the entire anti-stiction electrode system every M microseconds, every S seconds, etc. The first anti-stiction electrode driving algorithm may apply voltage to a sequence of areas within the anti-stiction electrode system at another predetermined time interval, etc.

The control circuitry for the anti-stiction electrode(s) may or may not be synchronized with that of the interferometric modulator system. For embodiments in which control circuitry for the anti-stiction system is synchronized with that of the interferometric modulator system, the anti-stiction electrodes may be driven according to one or more operations of a corresponding display device. For example, the anti-stiction electrode system could be driven once every time the corresponding display device displays a frame, once every time the corresponding display device has displayed N frames, etc. In some embodiments, voltage may be applied to the anti-stiction electrodes for only a few microseconds, which may be a fraction of the time corresponding with the display of a frame.

Similarly, voltage may be applied to a row or column of the anti-stiction electrodes when a corresponding row or column of the interferometric modulator is being "released," i.e., when voltage is not being applied to that row or column. However, it may not be necessary to drive a row or column of the anti-stiction electrodes each time that a corresponding row or column of the interferometric modulator is being released.

If the process continues (e.g., if the corresponding device remains on), method 1500 continues with a determination of whether a change in stiction conditions has been determined. (Step 1515.) This determination may, for example, involve the detection changes in capacitance of some or all of the display. If stiction problems are detected in an area of the interferometric modulator array, a more aggressive anti-stiction electrode driving algorithm may be selected for that portion of the array (step 1525) and applied (step 1505). For example, anti-stiction voltage may be applied to the corresponding rows and columns of the anti-stiction electrode more frequently in the area of the array with detected stiction than in other areas of the array.

Alternatively, this determination may involve a determination that a predetermined amount of time has elapsed. For some devices there may be a correspondence between the amount of stiction and device age. Therefore, after a device reaches a certain age, has been in operation for a predetermined time, etc., a more aggressive anti-stiction electrode driving algorithm may be selected (step 1525) and applied (step 1505).

If no change in stiction conditions is detected in step 1515, it is determined whether user input has been received, e.g., from a user input system of a device that includes the anti-stiction system and the interferometric modulator array. (Step 1520.) Some such devices may allow a user to select a more frequent application of voltage to the anti-stiction system, e.g., according to a graphical user interface ("GUI") that indicates various application frequencies that the user may select. The GUI may also inform the user that a more frequent application of voltage to the anti-stiction system will drain the device's battery more quickly. If the user selects another anti-stiction electrode driving algorithm, that algorithm is applied. (Step 1505.) Otherwise, the prior anti-stiction electrode driving algorithm will be applied. The process ends in step 1530.

Figure 16:
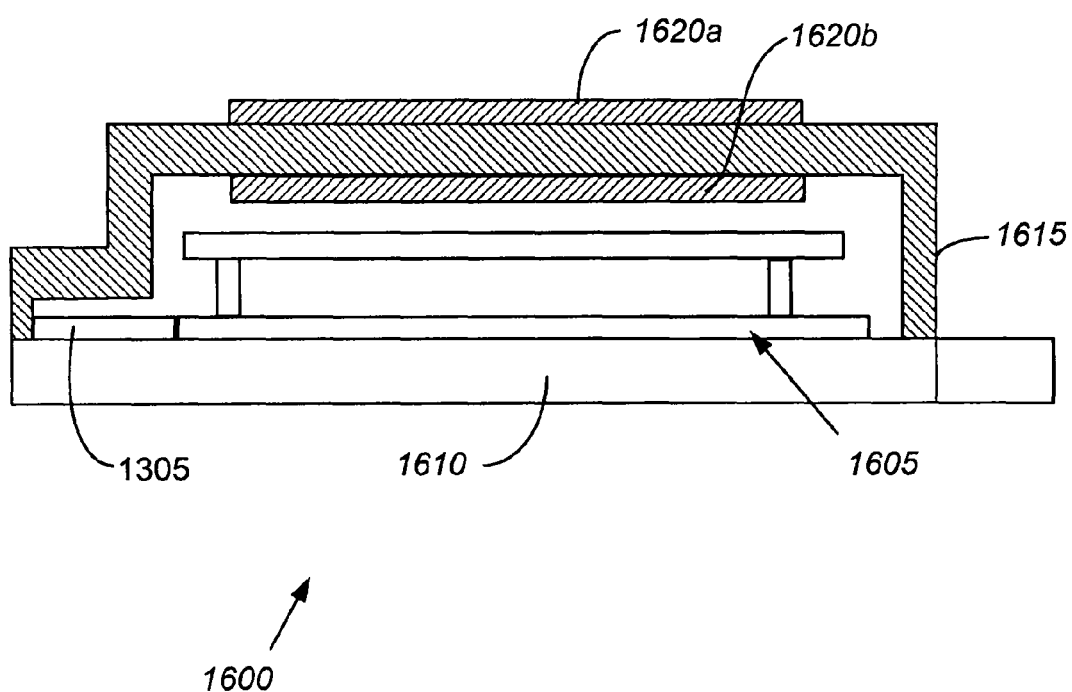
FIG. 16 depicts yet another embodiment of a device that includes anti-stiction electrodes and an array substrate.

FIG. 16 depicts an alternative embodiment for deploying anti-stiction electrode systems in a MEMS device, such as a device that includes an array of interferometric modulators. Device 1600 includes interferometric modulator array 1605 disposed on array substrate 1610, which may be formed substantially as described above. Desiccant layer 1305 may also be formed, e.g., on array substrate 1610. In this embodiment, however, packaging layer 1615 is deposited on substrate 1610 instead of being formed as part of a separate process. Electrode system 1620a may be formed on packaging layer 1615. Alternatively, packaging layer 1615 may be deposited after electrode system 1620b is formed.

Figure 17:
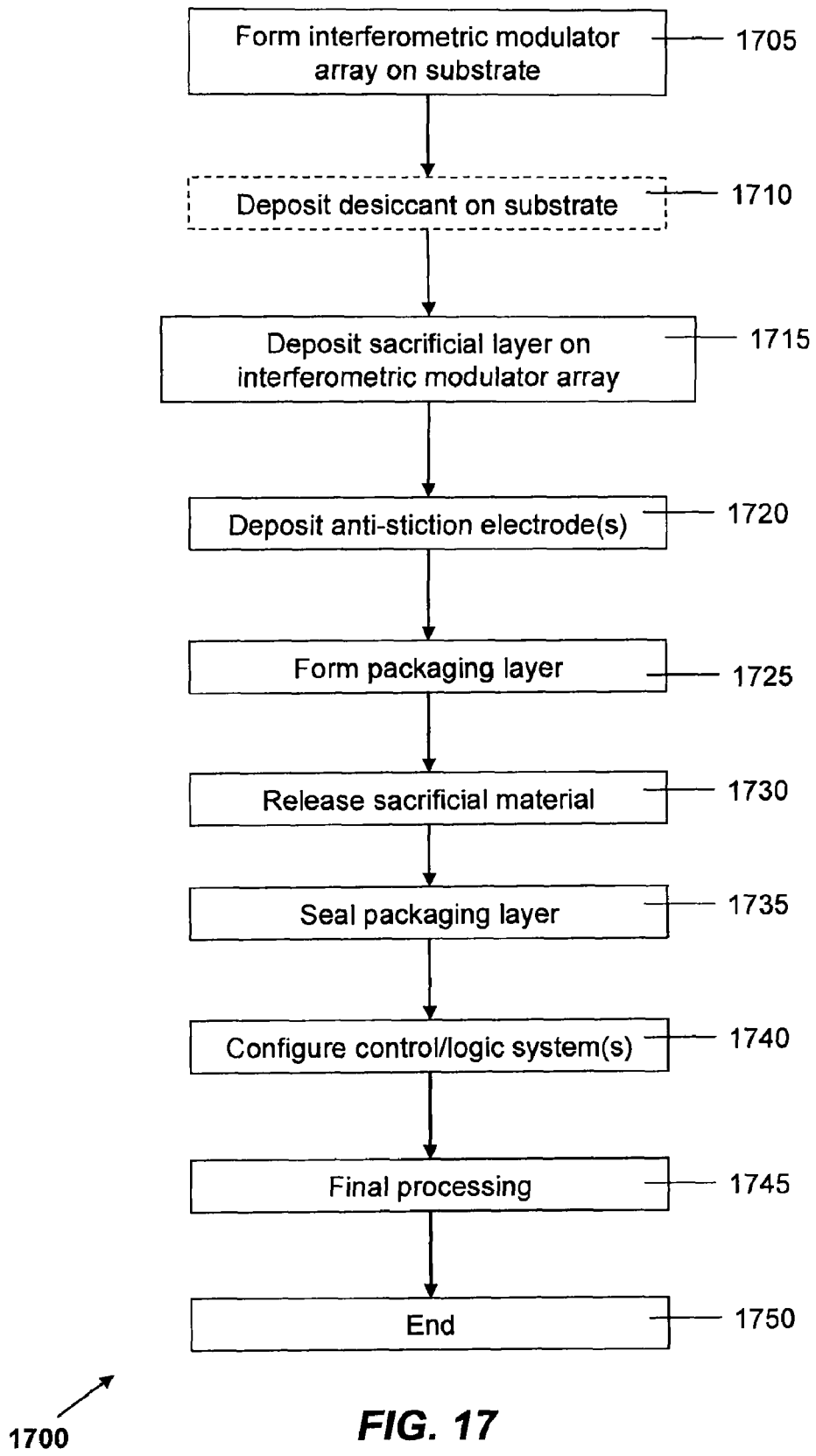
FIG. 17 is a flow chart that sets forth steps of fabricating a device such as the device shown in FIG. 16.

FIG. 17 is a flow chart that depicts steps of method 1700 that may be used to form device 1600 or a comparable device. In step 1705, an interferometric modulator array (such as modulator array 1605 of FIG. 16) is deposited on a substrate. Desiccant may also be deposited, e.g., on the substrate. (Optional step 1710.) Whether a desiccant layer is provided may depend on the material and processes used to form the packaging layer. For example, it may be advantageous to include a desiccant layer inside the package if the packaging layer might not provide a hermetic seal.

In step 1715, a sacrificial layer is deposited on the interferometric modulator array, on the exposed portions of the substrate and on other components, if any (e.g., on the desiccant layer). In this example, an anti-stiction electrode system (such as electrode system 1620b of FIG. 16) is deposited in step 1720 before the packaging layer is deposited in step 1725. In this example, the packaging layer is deposited on the anti-stiction electrode system, on exposed portions of the substrate and on exposed portions of the sacrificial layer. The packaging layer may be formed of any suitable material, such as plastic, ceramic, metal, etc.

As with other methods described herein, the steps shown in FIG. 17 are not necessarily performed in the order indicated.

For example, in alternative embodiments, the packaging layer may be deposited first and then an anti-stiction electrode system (such as electrode system 1620*a* of FIG. 16) may be deposited on the packaging layer.

The sacrificial material is released in step 1730. Releasing the sacrificial material may require that one or more openings remain between the packaging layer and the substrate. Accordingly, in this example the packaging layer is sealed in step 1735. Here, the logic system for the anti-stiction electrode system is configured in step 1740, though in alternative embodiments the logic system for the anti-stiction electrode system may already have been configured. Final processing steps, such as dicing, incorporating the resulting device in another apparatus, etc., are performed next. (Step 1745.) The process ends in step 1750.

Although illustrative embodiments and applications of this invention are shown and described herein, many variations and modifications are possible which remain within the concept, scope, and spirit of the invention, and these variations should become clear after perusal of this application. For example, anti-stiction electrodes may be formed as part of an interferometric modulator array.

Moreover, anti-stiction electrodes may be formed for use with MEMS devices and/or systems other than interferometric modulator arrays. Some such MEMS devices may include three electrodes, e.g., two electrodes formed on a first substrate and a third electrodes formed on another substrate. The substrates may or may not be substantially transparent. Whether the substrates are substantially transparent may depend, for example, on the type of MEMS devices that are being fabricated, on the intended usage of the MEMS devices, etc. Other MEMS devices may include more than three electrodes. Some such MEMS devices may be formed as part of an integrated thin film package. Accordingly, the present embodiments are to be considered as illustrative and not restrictive, and the invention is not to be limited to the details given herein, but may be modified within the scope and equivalents of the appended claims.

I claim:

1. An apparatus, comprising:
   a first substantially transparent substrate;
   an array of interferometric modulation elements disposed on the first substantially transparent substrate, the interferometric modulation elements including two layers that define a cavity, a first layer being movable relative to a second layer through a range of positions, the layers causing the cavity to operate interferometrically in at least one of the positions, producing an optical response to visible light;
   a first plurality of electrodes configured for conducting electrical signals to the array of interferometric modulation elements;
   first control circuitry configured to apply electrical signals for controlling the array of interferometric modulation elements via the first plurality of electrodes;
   a logic system that is configured to determine a stiction area within the array of interferometric modulation elements, the stiction area including a portion of the interferometric modulators in the array of interferometric modulation elements in which stiction has been detected;
   a second substrate;
   a second plurality of electrodes disposed on the second substrate; and
   second control circuitry configured to apply a first voltage pulse to the stiction area under the control of the logic system, the first voltage pulse that causes an electric force to be exerted on the first layer that is sufficient to overcome a stiction force between the first layer and the second layer in the stiction area.

2. The apparatus of claim 1, wherein the first substantially transparent substrate is on a first side of the movable layer and the second substrate is on a second and opposing side of the movable layer.

3. The apparatus of claim 1, wherein the interferometric modulation elements provide a mechanical force that tends to separate the first layer from the second layer and wherein the sum of the mechanical force and the electric force is greater than or equal to the stiction force.

4. The apparatus of claim 1, wherein the second plurality of electrodes is patterned into rows and columns on the second substrate.

5. The apparatus of claim 1, wherein the second control circuitry is further configured to apply a second voltage pulse simultaneously to substantially all of the second plurality of electrodes.

6. The apparatus of claim 1, wherein the second control circuitry is configured to apply voltage pulses that are synchronized with the electrical signals of the first plurality of electrodes.

7. The apparatus of claim 1, wherein the second control circuitry is configured to apply voltage pulses that are asynchronous with the electrical signals of the first plurality of electrodes.

8. The apparatus of claim 1, further comprising:
   a display;
   a processor that is configured to communicate with the display, the processor being configured to process image data; and
   a memory device that is configured to communicate with the processor.

9. The apparatus as recited in claim 8, further including a driver circuit configured to send at least one signal to the display.

10. The apparatus as recited in claim 9, further including a controller configured to send at least a portion of the image data to the driver circuit.

11. The apparatus as recited in claim 8, further including an image source module configured to send the image data to the processor.

12. The apparatus as recited in claim 11, wherein the image source module includes at least one of a receiver, a transceiver or a transmitter.

13. The apparatus as recited in claim 8, further including an input device configured to receive input data and to communicate the input data to the processor.

14. The apparatus of claim 1, wherein the logic system determines the stiction areas according to changes in capacitance.

15. The apparatus of claim 1, wherein the logic system includes at least one processor.

16. An apparatus, comprising:
   a first substantially transparent substrate;
   interferometric modulation means for producing a predetermined optical response to visible light, the interferometric modulation means being disposed on the first substantially transparent substrate and including a first layer configured to be movable relative to a second layer;
   control means for determining a stiction area of the interferometric modulation means;
   a second substrate; and
   anti-stiction means disposed, at least in part, on the second substrate and configured to exert an electric force to the stiction area, the force being on the first layer that is sufficient to overcome a stiction force between the first layer and the second layer in the stiction area.

17. The apparatus of claim 16, wherein the interferometric modulation means provide a mechanical force and wherein the sum of the mechanical force and the electric force is greater than or equal to the stiction force.

18. The apparatus of claim 16, wherein the anti-stiction means includes a plurality of electrodes.

19. The apparatus of claim 18, wherein the anti-stiction means is configured to apply a voltage pulse to a selected area of the plurality of electrodes.

20. The apparatus of claim 16, wherein the anti-stiction means includes a single electrode disposed on the second substrate.

21. The apparatus of claim 16, further means for determining stiction areas of the interferometric modulation means.

22. The apparatus of claim 16, wherein the anti-stiction means is configured to apply first voltage pulses that are synchronized with second voltage pulses of the interferometric modulation means.

* * * * *